(12) United States Patent
Wieczorek et al.

(10) Patent No.: US 7,067,410 B2
(45) Date of Patent: Jun. 27, 2006

(54) METHOD OF FORMING A METAL SILICIDE

(75) Inventors: Karsten Wieczorek, Dresden (DE); Thorsten Kammler, Ottendorf-Okrilla (DE); Manfred Horstmann, Duerroehrsdorf-Dittersbach (DE)

(73) Assignee: Advanced Micro Devices, Inc., Austin, TX (US)

( * ) Notice: Subject to any disclaimer, the term of this patent is extended or adjusted under 35 U.S.C. 154(b) by 1 day.

(21) Appl. No.: 10/835,182

(22) Filed: Apr. 29, 2004

(65) Prior Publication Data

US 2004/0241971 A1 Dec. 2, 2004

(30) Foreign Application Priority Data

May 30, 2003 (DE) ................. 103 24 657

(51) Int. Cl.
*H01L 21/3205* (2006.01)

(52) U.S. Cl. ............ 438/592; 438/766; 438/664; 438/655; 438/682; 438/683; 438/659; 438/528; 438/663; 438/798; 438/765; 438/423; 438/649

(58) Field of Classification Search .......... 438/682, 438/683, 766, 664, 655, 659, 528, 592, 663, 438/798, 765, 423, 649
See application file for complete search history.

(56) References Cited

U.S. PATENT DOCUMENTS

| 5,449,642 | A | * | 9/1995 | Tan et al. ............... 438/151 |
| 5,563,100 | A | * | 10/1996 | Matsubara ............. 438/303 |
| 5,567,651 | A | * | 10/1996 | Berti et al. ............ 438/303 |
| 6,096,628 | A | * | 8/2000 | Greenlaw et al. ....... 438/530 |
| 6,096,647 | A | * | 8/2000 | Yang et al. ............. 438/682 |
| 6,274,511 | B1 | | 8/2001 | Wieczorek et al. ..... 438/766 |
| 6,323,130 | B1 | * | 11/2001 | Brodsky et al. ........ 438/682 |
| 6,329,276 | B1 | * | 12/2001 | Ku et al. ............... 438/586 |
| 6,368,949 | B1 | * | 4/2002 | Chen et al. ............ 438/592 |
| 6,465,335 | B1 | * | 10/2002 | Kunikiyo ............... 438/592 |
| 6,475,908 | B1 | | 11/2002 | Lin et al. .............. 438/659 |
| 6,767,796 | B1 | * | 7/2004 | Tanaka et al. .......... 438/299 |
| 2002/0086486 | A1 | * | 7/2002 | Tanaka et al. ........ 438/300 |
| 2004/0087121 | A1 | * | 5/2004 | Kammler et al. ....... 438/528 |
| 2004/0248393 | A1 | * | 12/2004 | Tanaka et al. ........ 438/585 |
| 2005/0098818 | A1 | * | 5/2005 | Feudel et al. .......... 257/310 |

FOREIGN PATENT DOCUMENTS

JP 2001352058 A 12/2001

* cited by examiner

*Primary Examiner*—Asok K. Sarkar
*Assistant Examiner*—Victor V. Yevsikov
(74) *Attorney, Agent, or Firm*—Williams, Morgan & Amerson, P.C.

(57) ABSTRACT

The present invention provides a technique for forming a metal silicide, such as a cobalt disilicide, even at extremely scaled device dimensions without unduly degrading the film integrity of the metal silicide. To this end, an ion implantation may be performed, advantageously with silicon, prior to a final anneal cycle, thereby correspondingly modifying the grain structure of the precursor of the metal silicide.

17 Claims, 3 Drawing Sheets

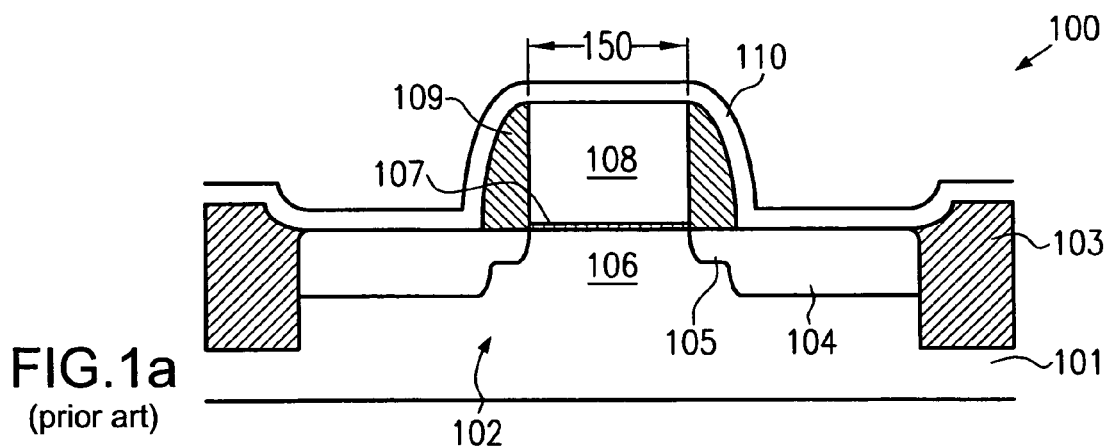
FIG.1a (prior art)
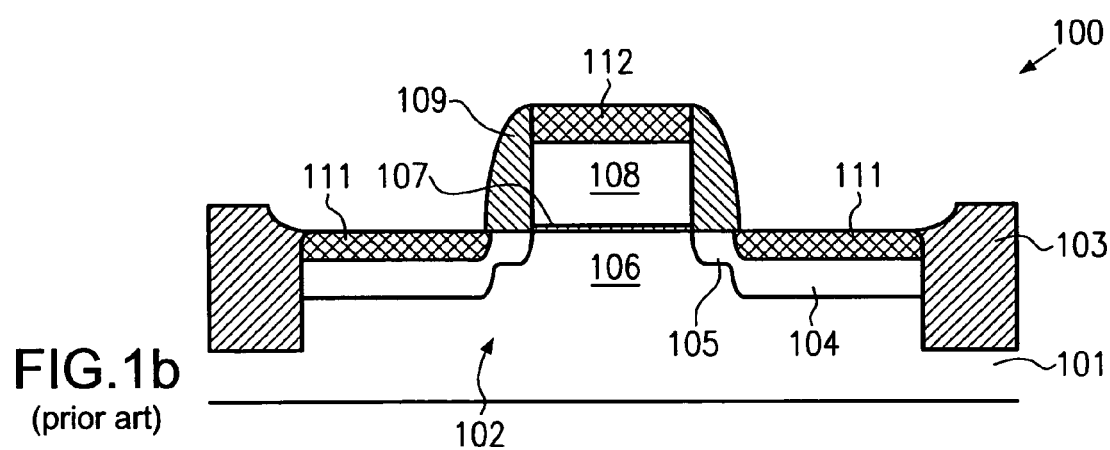
FIG.1b (prior art)
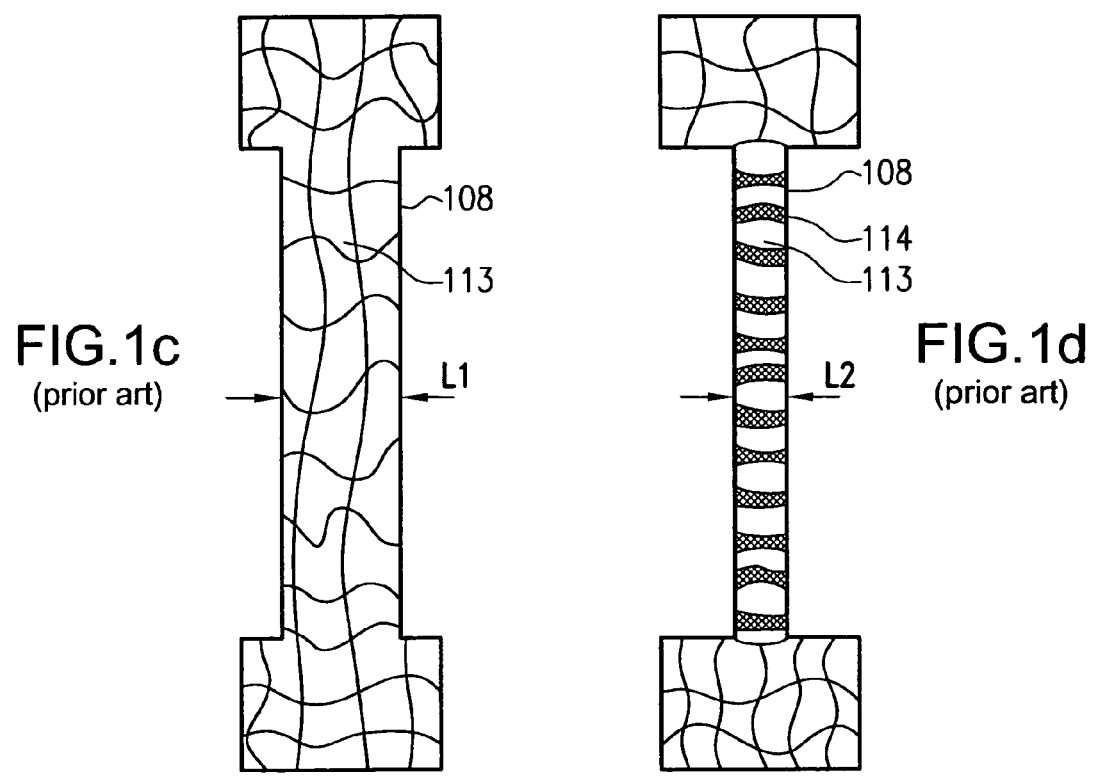
FIG.1c (prior art)
FIG.1d (prior art)

METHOD OF FORMING A METAL SILICIDE

BACKGROUND OF THE INVENTION

1. Field of the Invention

Generally, the present invention relates to the fabrication of integrated circuits, and, more particularly, to the formation of metal silicide regions on silicon-containing conductive circuit elements to decrease a sheet resistance thereof.

2. Description of the Related Art

In modern ultra-high density integrated circuits, device features are steadily decreasing to enhance device performance and functionality of the circuit. Shrinking the feature sizes, however, entails certain problems that may partially offset the advantages obtained by reducing the feature sizes. Generally, reducing the size of, for example, a transistor element such as a MOS transistor, may lead to superior performance characteristics due to a decreased channel length of the transistor element, resulting in a higher drive current capability and enhanced switching speed. Upon decreasing the channel length of the transistor elements, however, the electrical resistance of conductive lines and contact regions, i.e., of regions that provide electrical contact to the periphery of the transistor elements, becomes a major issue since the cross-sectional area of these lines and regions is also reduced. The cross-sectional area, however, determines, in combination with the characteristics of the material comprising the conductive lines and contact regions, the effective electrical resistance thereof.

Moreover, a higher number of circuit elements per unit area also requires an increased number of interconnections between these circuit elements, wherein, commonly, the number of required interconnects increases in a non-linear manner with the number of circuit elements so that the available real estate for interconnects becomes even more limited.

The majority of integrated circuits are based on silicon, that is, most of the circuit elements contain silicon regions, in crystalline, polycrystalline and amorphous form, doped and undoped, which act as conductive areas. An illustrative example in this context is a gate electrode of a MOS transistor element, which may be considered as a polysilicon line. Upon application of an appropriate control voltage to the gate electrode, a conductive channel is formed at the interface of a thin gate insulation layer and an active region of the semiconducting substrate. Although reducing the feature size of a transistor element improves device performance due to the reduced channel length, the shrinkage of the gate electrode (in the gate length direction), however, may result in significant delays in the signal propagation along the gate electrode, i.e., the formation of the channel along the entire extension (in the gate width direction) of the gate electrode. The issue of signal propagation delay is even exacerbated for polysilicon lines connecting individual circuit elements or different chip regions. Therefore, it is extremely important to improve the sheet resistance of polysilicon lines and other silicon-containing contact regions to allow further device scaling without compromising device performance. For this reason, it has become standard practice to reduce the sheet resistance of polysilicon lines and silicon contact regions by forming a metal silicide in and on appropriate portions of the respective silicon-containing regions.

With reference to FIGS. 1a–1d, a typical prior art process flow for forming metal silicide on a corresponding portion of a MOS transistor element will now be described as an illustrative example for demonstrating the reduction of the sheet resistance of silicon.

FIG. 1a schematically shows a cross-sectional view of a transistor element 100, such as a MOS transistor that is formed on a substrate 101 including a silicon-containing active region 102. The active region 102 is enclosed by an isolation structure 103, which in the present example is provided in the form of a shallow trench isolation usually used for sophisticated integrated circuits. Highly doped source and drain regions 104 including extension regions 105 that usually comprise a dopant concentration less than the highly doped regions 104 are formed in the active region 102. The source and drain regions 104 including the extension regions 105 are laterally separated by a channel region 106. A gate insulation layer 107 electrically and physically isolates a gate electrode 108 from the underlying channel region 106. Spacer elements 109 are formed on sidewalls of the gate electrode 108. A refractory metal layer 110 is formed over the transistor element 100 with a thickness required for further processing in forming metal silicide portions.

A typical conventional process flow for forming the transistor element 100, as shown in FIG. 1a, may include the following steps. After defining the active region 102 by forming the shallow trench isolations 103 by means of advanced photolithography and etch techniques, well-established and well-known implantation steps are carried out to create a desired dopant profile in the active region 102 and the channel region 106.

Subsequently, the gate insulation layer 107 and the gate electrode 108 are formed by sophisticated deposition, photolithography and anisotropic etch techniques to obtain a desired gate length, which is the horizontal extension of the gate electrode 108 as indicated by the double arrow 150 in FIG. 1a, i.e., in the plane of the drawing of FIG. 1a. Thereafter, a first implant sequence may be carried out to form the extension regions 105 wherein, depending on design requirements, additional so-called halo implants may be performed.

The spacer elements 109 are then formed by depositing a dielectric material, such as silicon dioxide and/or silicon nitride, and patterning the dielectric material by an anisotropic etch process. Thereafter, a further implant process may be carried out to form the heavily doped source and drain regions 104.

Subsequently, the refractory metal layer 110 is deposited on the transistor element 100 by, for example, chemical vapor deposition (CVD) or physical vapor deposition (PVD). Preferably, a refractory metal such as titanium, cobalt and the like is used for the metal layer 110. It turns out, however, that the characteristics of the various refractory metals during the formation of a metal silicide and afterwards in the form of a metal silicide significantly differ from each other. Consequently, selecting an appropriate metal depends on further design parameters of the transistor element 100 as well as on process requirements in following processes. For instance, titanium is frequently used for forming a metal silicide on the respective silicon-containing portions wherein, however, the electrical properties of the resulting titanium silicide strongly depend on the dimensions of the transistor element 100. Titanium silicide tends to agglomerate at grain boundaries of polysilicon and therefore may increase the total electrical resistance, wherein this effect is pronounced with decreasing feature sizes so that the employment of titanium may not be acceptable for polysilicon lines, such as the gate electrode 108 having a lateral dimension, i.e., a gate length, of 0.2 µm and less.

For circuit elements having feature sizes of this order of magnitude, cobalt is preferably used as a refractory metal, since cobalt does not substantially exhibit a tendency for blocking grain boundaries of the polysilicon. In the further description of the conventional process flow, it is therefore assumed that the metal layer 110 is comprised of cobalt so as to allow the formation of the transistor element 100 as a sophisticated device having a gate length much less than 0.2 µm.

A first anneal cycle is performed to initiate a reaction between the cobalt in the layer 110 and the silicon in the drain and source regions 104 and the polysilicon in the gate electrode 108. Optionally, a titanium nitride layer having a thickness in the range of approximately 10–20 nm may be deposited above the refractory metal layer 110 prior to annealing the substrate 101 to decrease the finally obtained sheet resistance of the cobalt disilicide by reducing an oxidation of cobalt in the subsequent anneal cycles. Typically, the anneal temperature may range from approximately 450–550° C. to produce cobalt mono-silicide. Thereafter, non-reacted cobalt is selectively etched away and then a second anneal cycle is performed with a higher temperature of approximately 700° C. to convert cobalt monosilicide into cobalt disilicide.

FIG. 1b schematically shows the transistor element 100 with cobalt disilicide regions 111 formed on the drain and source region 104 and a cobalt disilicide region 112 on the gate electrode 108. Although cobalt may successfully be used for feature sizes of approximately 0.2 µm and even less, it turns out that, for further device scaling, requiring a gate length well beyond 100 nm, the sheet resistance of the cobalt disilicide enhanced gate electrode 108 increases more rapidly than expected by merely taking into account the reduced feature size of the gate electrode 108. It is believed that the drastic increase of the resistivity of the region 112 is caused by tensile stress between individual cobalt disilicide grains, thereby significantly affecting the film integrity of the cobalt disilicide when the gate length is of the order of magnitude of a single grain.

FIGS. 1c and 1d schematically represent the situation for the gate electrode 108 having a gate length L1 of approximately 200 nm compared to a gate length L2 of approximately 50 nm. FIG. 1c depicts the gate electrode 108 with the gate length L1, containing a plurality of single grains 113 arranged along the length L1, whereas, as is shown in FIG. 1d, only one single grain 113 is formed across the length L2. While the thermal stress induced during the second anneal cycle in converting cobalt monosilicide into cobalt disilicide may be compensated for by the plurality of grains across the length L1, the single grain formed across the length L2 may not allow efficient absorption of the stress and may cause an interruption of the cobalt disilicide film, as indicated by 114. As a consequence, the sheet resistance of the polysilicon gate electrode is drastically increased, thereby preventing aggressive device scaling without unduly degrading the transistor performance.

In view of the above-explained problems, there exists a need for an improved silicide formation technique, enabling further device scaling.

SUMMARY OF THE INVENTION

Generally, the present invention is directed to a technique for reducing the sheet resistivity of a metal disilicide layer, in particular that of a cobalt disilicide layer. Without limiting the present invention to the following explanation, it is believed that, by means of substantially amorphizing grains of a metal monosilicide prior to the conversion to a metal disilicide, a thermal stress induced by the subsequent conversion may be significantly reduced. Moreover, by introducing silicon into the metal monosilicide during the amorphization process, the anneal time and/or the anneal temperature in converting the monosilicide into a disilicide may be reduced, thereby also decreasing the amount of thermal stress in the resulting metal disilicide. Moreover, the implantation of silicon into metal-containing regions prior to the final anneal process for forming a metal silicide may reduce the thermal budget.

According to one illustrative embodiment of the present invention, a method of forming a metal silicide comprises the deposition of a layer of refractory metal over a silicon region formed on a substrate. Then, the substrate is annealed to form a metal monosilicide, and an ionic species is introduced into the metal monosilicide. Finally, the substrate is annealed to convert the metal monosilicide into a metal disilicide.

In accordance with another illustrative embodiment of the present invention, a method comprises forming a metal silicon compound layer over a silicon region formed on a substrate and implanting silicon into the metal silicon compound layer. Finally, the metal silicon compound layer is annealed to form a metal silicide.

According to still another illustrative embodiment of the present invention, a method of forming a metal silicide on a gate electrode comprises forming a transistor element on a substrate, wherein the transistor includes a gate electrode and a drain region and a source region. Then, a refractory metal layer is formed over the transistor element and silicon is implanted at least into the refractory metal layer. Moreover, the substrate is annealed to form a metal silicide region in the gate electrode and the drain and source regions.

BRIEF DESCRIPTION OF THE DRAWINGS

The invention may be understood by reference to the following description taken in conjunction with the accompanying drawings, in which like reference numerals identify like elements, and in which:

FIGS. 1a–1d schematically show cross-sectional views and a top view, respectively, of a conventional transistor element during various stages of the manufacturing process.

Figure 2A:
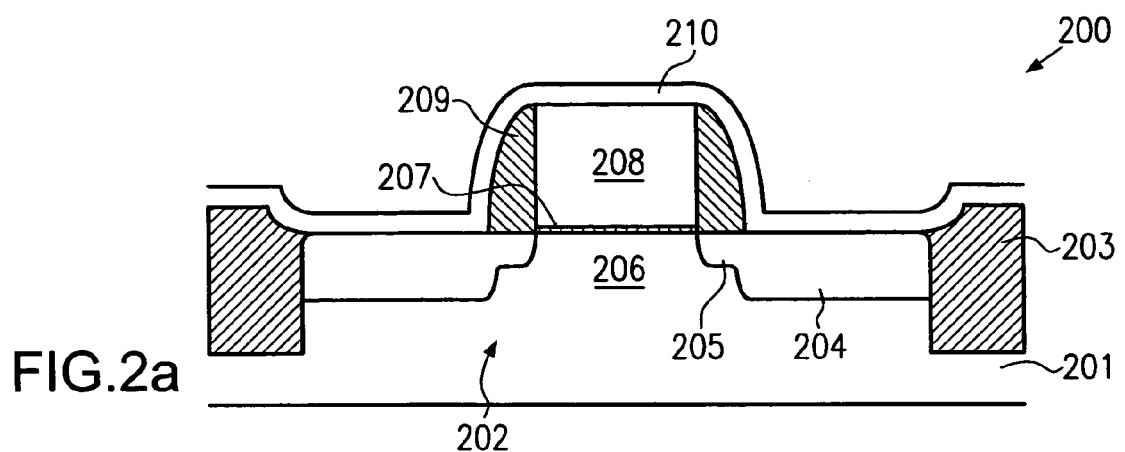
FIGS. 2a–2d schematically show cross-sectional views and a top view, respectively, of silicon-containing conductive regions, especially in the form of a transistor gate electrode, during various manufacturing stages in accordance with illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is particularly advantageous in forming silicon lines having at least one dimension that is within the order of magnitude of a typical grain size of a metal disilicide formed on top of the silicon line so as to reduce the sheet resistance thereof. In particular, aggressively scaled gate electrodes may be formed without unduly compromising transistor performance due to an unproportionally increased gate electrode sheet resistance, as is the case in conventionally formed transistor elements having a gate length of 0.1 μm and less. The principles of the present invention, however, may also be applied to any circuit elements requiring the formation of a metal silicide for reducing the sheet resistance, irrespective of the actual device dimensions. In particular, the introduction of silicon, prior to the final anneal cycle, may allow a significant reduction of the anneal process time and/or the anneal temperature, thereby also reducing the thermal budget in forming a semiconductor device.

With reference to FIGS. 2a–2d, further illustrative embodiments of the present invention will now be described in more detail. FIG. 2a schematically shows a cross-sectional view of a transistor element 200 comprising a substrate 201 having formed therein a trench isolation structure 203 enclosing an active region 202. A gate electrode 208 is formed on a gate insulation layer 207 that separates the gate electrode 208 from a channel region 206, which, in turn, laterally separates drain and source regions 204 including respective extension regions 205. Moreover, dielectric sidewall spacers 209 are formed on sidewalls of the gate electrode 208. Finally, a refractory metal layer 210 is formed over the gate electrode 208 and the drain and source regions 204. In one particular embodiment, the refractory metal layer 210 is substantially comprised of cobalt, whereas, in other embodiments, any other appropriate metal, such as titanium, nickel, tungsten and the like, may be used when considered appropriate for the formation of the transistor element 200.

Regarding a process flow for manufacturing the transistor element 200, as shown in FIG. 2a, basically the same processes may be performed as are already described with reference to the transistor element 100 shown in FIG. 1a. Thus, a detailed description thereof is omitted here.

After the deposition of the refractory metal layer 210, in some embodiments, a cap layer (not shown), for instance comprising titanium nitride, may be deposited so as to provide superior protection against oxidation in the subsequent anneal cycles. Then, in one embodiment, a first anneal process may be performed at a temperature of approximately 450–550° C. to form a metal monosilicide, such as cobalt monosilicide, on top of the gate electrode 208 and on top of the drain and source regions 204. In one embodiment, any non-reacted portion of the refractory metal layer 210 may then be removed by a selective wet chemical etch process as is well known in the art.

Figure 2B:
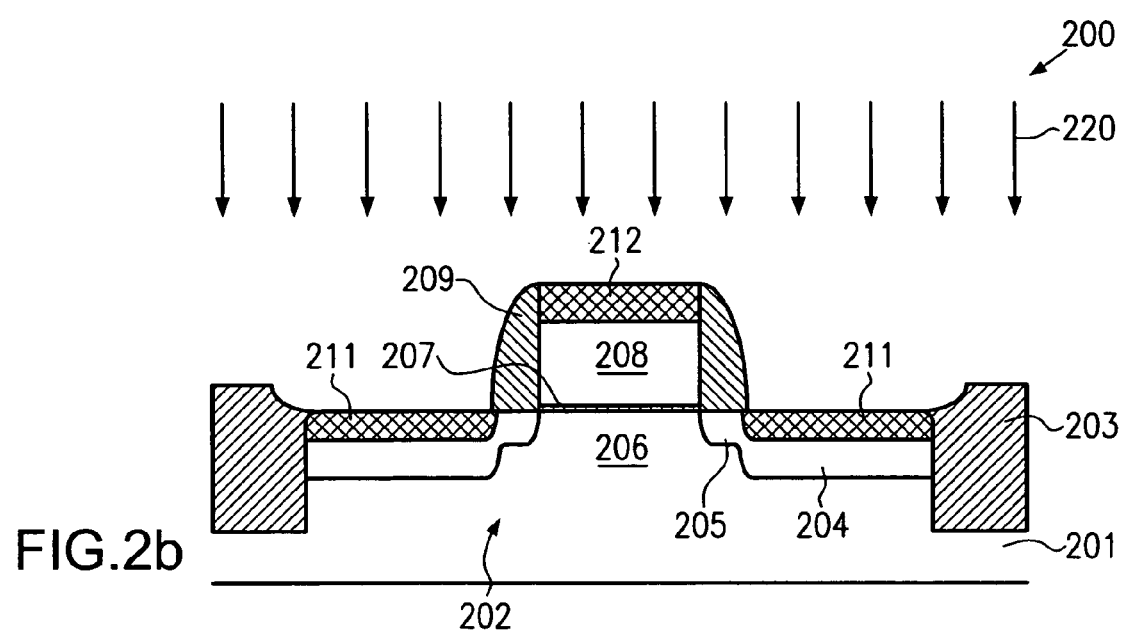

FIG. 2b schematically shows the transistor element 200 while being exposed to an ion bombardment indicated by 220, wherein metal monosilicide regions 211 are formed on the drain and the source regions 204 and a metal monosilicide region 212 is formed on the gate electrode 208. In one particular embodiment, the ion bombardment comprises silicon ions at a dose in the range of approximately $10^{15}$–$10^{16}$ atoms/cm$^2$ so as to modify the structure of the regions 211 and especially of the region 212. Advantageously, the ion bombardment 220 is carried out in the form of an ion implantation sequence at an implantation energy that substantially confines the implanted ionic species within the regions 211 and 212. For instance, for a silicon implantation, the implantation energy may be selected in the range of approximately 10–30 keV. By means of the ion bombardment 220, the regions 211 and 212 may substantially be amorphized, thereby significantly destroying or at least reducing the size of any grains formed in the regions 211 and 212. In other embodiments, the grain size reduction or amorphizing of the regions 211 and 212 may be accomplished by ion bombardment with inert ionic species, such as noble gas ions and the like. The implantation energy may then appropriately be adapted to the respective species used by means of well-established simulation algorithms.

In further illustrative embodiments, starting from the arrangement as shown in FIG. 2a, the ion bombardment 220 may be performed prior to the selective removal of non-reacted metal of the layer 210. In this way, the non-reacted metal may act as an implantation mask for substrate regions that are not intended to receive a metal silicide, thereby reducing implantation-induced damage. Thereafter, the non-reacted metal including the implanted ionic species may be removed.

Subsequently, a second anneal cycle is performed at a temperature in the range of approximately 600–700° C., for instance if the regions 211 and 212 are substantially comprised of cobalt monosilicide, to convert the metal monosilicide into a metal disilicide. Without restricting the present invention, it is believed that amorphization of the metal monosilicide by the ion bombardment 220 may significantly reduce the build-up of induced stress in the regions 211 and 212. Moreover, in the embodiments in which silicon is used as the implantation species introduced into the metal monosilicide regions 211 and 212, a further silicon source is provided to feed the further reaction of the metal monosilicide with silicon, thereby reducing the required temperature and/or the required duration of the second anneal cycle. The reduced temperature and/or duration of the second anneal cycle will also positively contribute to a reduction of thermal stress in the resulting metal disilicide. Moreover, since elevated temperature and durations of anneal cycles after the formation of the transistor device 200, that is after the formation of the sensitive dopant profiles in the drain and source regions 204 and the channel region 206, contribute to the thermal budget of the transistor element 200, a reduction of temperature and/or anneal duration may allow the creation of more accurate dopant profiles. As is generally understood in the art, the thermal budget of a semiconductor device represents an area below a temperature versus time curve or the area below a diffusivity versus time curve during the entire manufacturing process of the semiconductor device. Since extremely scaled transistor devices require a well-defined dopant profile, the thermal budget should be maintained as low as possible. Thus, a reduction in temperature and/or duration of a high temperature process, such as the cobalt monosilicide-disilicide-conversion, may enhance device reliability and may also assist in increasing throughput due to a reduced process time.

It should be noted that in view of the thermal budget of a transistor device, for refractory metals other than cobalt, titanium, and the like, which may not require a two-step anneal process, the ion bombardment 220 may be carried out at the manufacturing stage as shown in FIG. 2a so as to introduce silicon at a high dose into the refractory metal layer 210, thereby significantly enhancing the efficiency of a subsequent anneal cycle in forming a corresponding silicide, thereby providing the benefit of reduced temperature and/or duration.

Figure 2C:
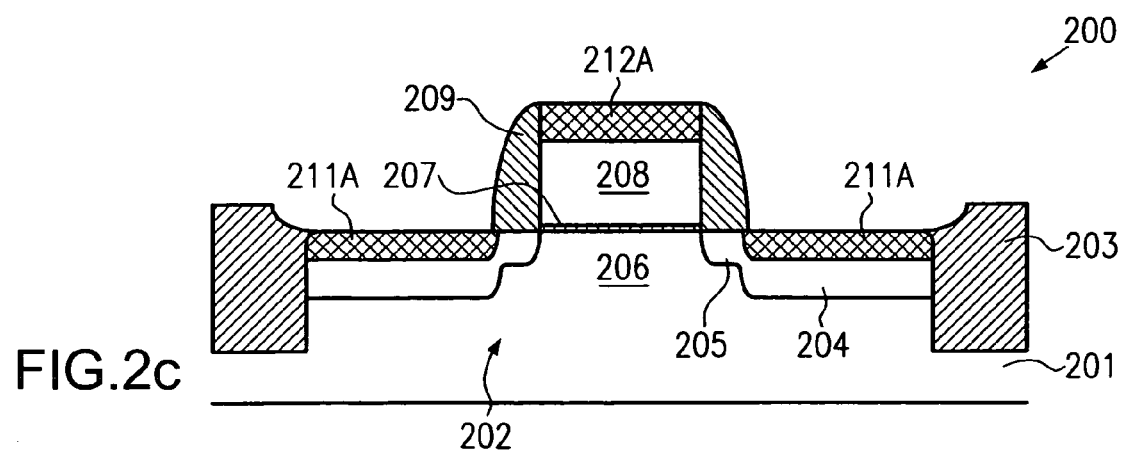

FIG. 2c schematically shows the transistor element 200 after the conversion of the metal monosilicide region 212, 211 to a cobalt disilicide region, which are now indicted as 212a, 211a, when a refractory metal, such as cobalt, has been used. Due to the ion bombardment 220, the thermal stress may be reduced within the region 212a, thereby significantly less affecting the film integrity compared to the conventional cobalt disilicide region 12 as shown in FIG. 1b. Moreover, in the embodiments using silicon as the ionic species, irrespective of whether a one-step or a multi-step anneal cycle is to be used in forming a metal silicide having the required low resistivity, the implanted silicon may support a chemical reaction with the refractory metal, thereby allowing reduced temperatures and/or durations, which may also contribute to a reduced thermal stress in the region 212a and to a reduced overall thermal budget.

Figure 2D:
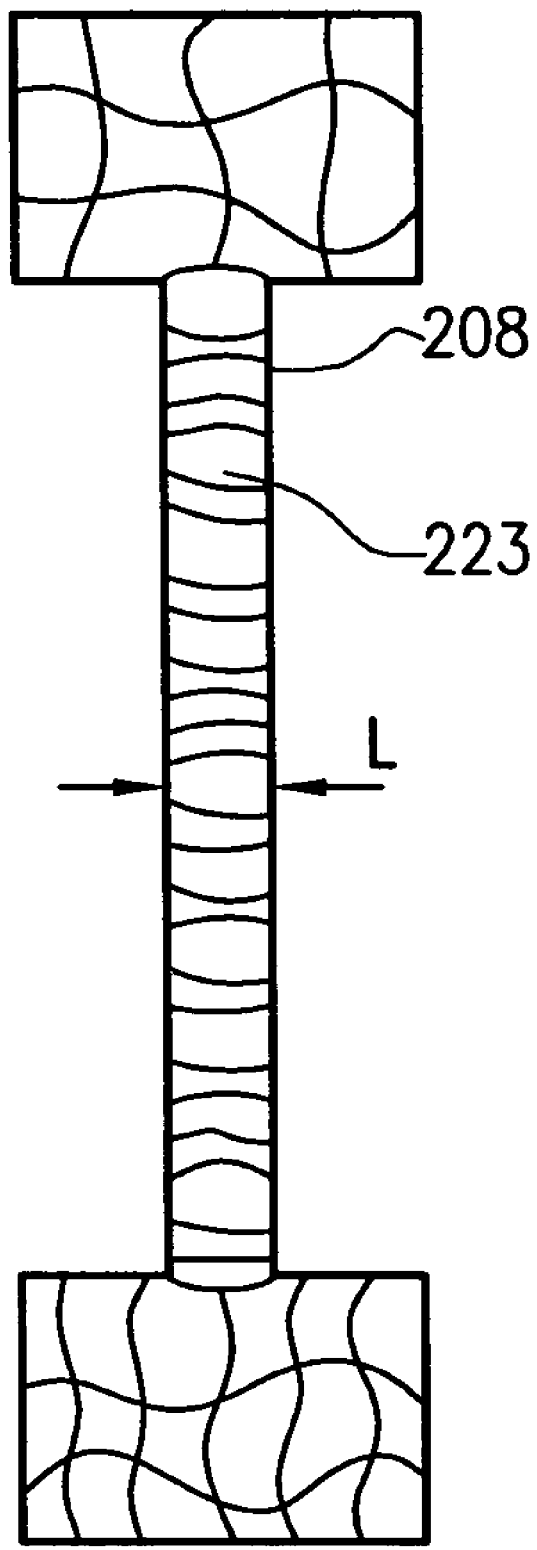

FIG. 2d schematically shows the gate electrode 208 with a gate length L of approximately 50 nm, wherein a single metal disilicide grain 213 extends across the entire length L. Contrary to the conventional technique, the metal disilicide film integrity, for example the cobalt disilicide film integrity, is significantly improved due to the reduced thermal stress, resulting in a superior sheet resistance compared to the conventional device.

As a result, the present invention provides a technique for forming a metal silicide on silicon or polysilicon regions, wherein, according to some embodiments, an ion implantation is performed between a first anneal cycle and a second anneal cycle so as to modify the crystallinity of the metal silicide formed after the first anneal cycle. Advantageously, the implantation is performed with silicon that may additionally serve as a source for feeding the subsequent further reaction of the metal silicide with silicon. In this way, the temperature and/or the duration of the second anneal cycle may be reduced, thereby not only reducing the thermal stress in the finally obtained disilicide but also reducing the overall thermal budget in manufacturing a semiconductor device. In other embodiments, the implantation of silicon may accelerate the reaction between metal and silicon, irrespective of the anneal scheme used, thereby also reducing the overall thermal budget. Thus, by using, for example, cobalt as the refractory metal, extremely scaled gate electrodes may be manufactured without unduly increasing the gate sheet resistance. Additionally, the reduction of the thermal budget assists in maintaining the required complex dopant profiles.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a metal silicide, the method comprising:
    depositing a layer of refractory metal over a silicon region formed on a substrate;
    annealing said substrate to form a metal monosilicide;
    introducing noble gas ions into said metal monosilicide; and
    annealing said substrate to convert said metal monosilicide into a metal disilicide.

2. The method of claim 1, wherein said noble gas ions are introduced by ion implantation.

3. The method of claim 2, wherein an implantation energy of said noble gas ions is selected to substantially confine said noble gas ions within said metal monosilicide.

4. The method of claim 1, further comprising removing non-reacted refractory metal.

5. The method of claim 4, wherein said non-reacted refractory metal is removed prior to introducing said noble gas ions.

6. The method of claim 4, wherein said non-reacted refractory metal is removed after introducing said noble gas ions.

7. The method of claim 1, wherein said refractory metal comprises cobalt.

8. The method of claim 1, further comprising forming a transistor element having a gate electrode and a drain and a source region prior to depositing said refractory metal layer.

9. The method of claim 8, wherein a gate length of said gate electrode is approximately 60 nm or less.

10. A method, comprising:
    forming a transistor element comprised of a gate electrode having a gate length of approximately 60 nm or less;
    forming a metal silicon compound layer over said gate electrode; implanting noble gas ions into said metal silicon compound layer; and
    annealing said metal silicon compound layer to form a low resistivity metal silicide in said gate electrode.

11. The method of claim 10, wherein said metal silicon compound layer comprises a metal silicide.

12. The method of claim 11, further comprising annealing said substrate at a first temperature to form said metal suicide.

13. The method of claim 12, further comprising removing non-reacted portions of said metal silicon compound prior to implanting said noble gas ions.

14. The method of claim 12, further comprising removing non-reacted portions of said metal silicon compound after implanting said noble gas ions.

15. The method of claim 12, further comprising annealing said substrate at a second temperature higher than the first temperature to transform said metal silicide in said low resistivity metal silicide.

16. The method of claim 10, wherein said metal silicon compound layer comprises cobalt.

17. A method of forming a metal silicide on a gate electrode, comprising:
    forming a transistor element on a substrate, said transistor element including a gate electrode and a drain region and a source region, said gate electrode having a gate length less than approximately 60 nm or less;
    forming a refractory metal layer over said transistor element;
    implanting noble gas ions into said refractory metal layer; and
    annealing said substrate to form a metal silicide region in said gate electrode and said drain and source regions.

* * * * *

UNITED STATES PATENT AND TRADEMARK OFFICE
CERTIFICATE OF CORRECTION

PATENT NO. : 7,067,410 B2 Page 1 of 1
APPLICATION NO. : 10/835182
DATED : June 27, 2006
INVENTOR(S) : Karsten Wieczorek, Thorsten Kammler and Manfred Horstmann It is certified that error appears in the above-identified patent and that said Letters Patent is hereby corrected as shown below:

Col. 9, line 5 (claim 12, line 3), change "suicide" to -- silicide --.

Signed and Sealed this

Eighth Day of August, 2006

JON W. DUDAS
*Director of the United States Patent and Trademark Office*